United States Patent
McCutchen et al.

(10) Patent No.: US 8,739,540 B2
(45) Date of Patent: *Jun. 3, 2014

(54) VAPOR VORTEX HEAT SINK

(75) Inventors: Wilmot H. McCutchen, Orinda, CA (US); David J. McCutchen, Portland, OR (US)

(73) Assignee: McCutchen Co., Portland, OR (US)

( * ) Notice: Subject to any disclaimer, the term of this patent is extended or adjusted under 35 U.S.C. 154(b) by 34 days.

This patent is subject to a terminal disclaimer.

(21) Appl. No.: 13/155,157

(22) Filed: Jun. 7, 2011

(65) Prior Publication Data

US 2011/0232875 A1    Sep. 29, 2011

Related U.S. Application Data

(63) Continuation of application No. 12/178,441, filed on Jul. 23, 2008, now Pat. No. 7,980,078.

(60) Provisional application No. 61/043,919, filed on Apr. 10, 2008, provisional application No. 61/041,110, filed on Mar. 31, 2008.

(51) Int. Cl.
*F01K 25/00*    (2006.01)
*F01K 7/00*    (2006.01)

(52) U.S. Cl.
USPC .............................................. 60/671; 60/675

(58) Field of Classification Search
USPC .............. 60/645, 655, 670, 675, 39.182, 651, 60/671
See application file for complete search history.

(56) References Cited

U.S. PATENT DOCUMENTS 1,952,281 A    3/1934 Ranque
3,894,395 A    7/1975 Laing (Continued)

OTHER PUBLICATIONS

A. Bergles, "The Implications and Challenges of Enhanced Heat Transfer for the Chemical Process Industries," Trans IChemE, May 2001, pp. 437-444, vol. 79, Part A., Institution of Chemical Engineers.

(Continued)

*Primary Examiner* — Hoang Nguyen
(74) *Attorney, Agent, or Firm* — Marger Johnson & McCollom, P.C.

(57) ABSTRACT

A hermetic Rankine cycle in a sealed casing powers an internal centrifugal condensate pump with an internal vapor turbine during forced convective heat transfer between a heat source and a heat sink. No work is imported into the cycle during operation. A centrifugal pumping disk shears the working fluid against a heating surface, sweeping evolving vapor into radial vortices which provide sink flow conduits to a vapor space at the center of the cylindrical turbine. Convective mass flow through the vapor space to the condensing end of the casing spins the turbine and the centrifugal pumping disk which is connected to it. Vapor is continuously swept from the heating surface, so bubbles do not form and superheat while blocking heat flux into liquid working fluid. Vapor is sucked through the radial vortices into the central vapor space and into the condensing end of the casing along the low pressure gradients in vortex cores established by cooling power. A high heat flux surface is thereby thermally connected to a conventional heat sink having high cooling power, for maximal heat extraction at data centers or other heat sources. Vapor vortices organize counterflow of vapor and condensate in a continuous mass flow cycle, and extract work from heat. Organic working fluids can be used in the casing to make even low temperature waste heat a power source.

14 Claims, 7 Drawing Sheets

(56) References Cited

U.S. PATENT DOCUMENTS

| | | | |
|---|---|---|---|
| 3,922,871 A | 12/1975 | Bolesta | |
| 3,982,378 A | 9/1976 | Sohre | |
| 3,999,400 A | 12/1976 | Gray | |
| 4,037,414 A | 7/1977 | Nicodemus | |
| 4,116,005 A * | 9/1978 | Willyoung | 60/655 |
| 4,333,017 A | 6/1982 | O'Connell | |
| 4,362,020 A | 12/1982 | Meacher et al. | |
| 4,367,629 A | 1/1983 | Cann | |
| 4,479,354 A | 10/1984 | Cosby | |
| 4,884,169 A | 11/1989 | Cutchaw | |
| 5,137,681 A | 8/1992 | Dougherty | |
| 5,263,536 A | 11/1993 | Hulburd et al. | |
| 5,329,771 A * | 7/1994 | Kytomaki et al. | 60/657 |
| 5,390,077 A | 2/1995 | Paterson | |
| 5,441,102 A | 8/1995 | Burward-Hoy | |
| 5,570,579 A | 11/1996 | Larjola | |
| 5,611,214 A | 3/1997 | Wegeng et al. | |
| 5,860,279 A * | 1/1999 | Bronicki et al. | 60/655 |
| 6,019,165 A | 2/2000 | Batchelder | |
| 6,064,572 A | 5/2000 | Remsburg | |
| 6,208,512 B1 | 3/2001 | Goldowsky et al. | |
| 6,484,503 B1 | 11/2002 | Raz | |
| 6,494,935 B2 | 12/2002 | Cho et al. | |
| 6,516,617 B1 | 2/2003 | Schwieger | |
| 6,550,531 B1 | 4/2003 | Searls et al. | |
| 6,751,959 B1 | 6/2004 | McClanahan et al. | |
| 6,856,037 B2 | 2/2005 | Yazawa et al. | |
| 6,894,899 B2 | 5/2005 | Wu et al. | |
| 6,943,461 B2 | 9/2005 | Kaploun | |
| 6,945,314 B2 | 9/2005 | Farrow et al. | |
| 6,948,556 B1 * | 9/2005 | Anderson et al. | 165/80.4 |
| 6,986,251 B2 | 1/2006 | Radcliff et al. | |
| 7,002,800 B2 | 2/2006 | Elias et al. | |
| 7,035,104 B2 | 4/2006 | Meyer | |
| 7,055,581 B1 | 6/2006 | Roy | |
| 7,121,906 B2 | 10/2006 | Sundel | |
| 7,140,197 B2 | 11/2006 | Chordia et al. | |
| 7,263,836 B2 | 9/2007 | Gunawardana et al. | |
| 7,310,232 B2 | 12/2007 | Touzov | |
| 7,331,379 B2 | 2/2008 | Chen et al. | |
| 7,352,577 B2 | 4/2008 | Chen et al. | |
| 7,352,580 B2 | 4/2008 | Tsai | |
| 7,403,393 B2 | 7/2008 | Herring et al. | |
| 7,980,078 B2 * | 7/2011 | McCutchen et al. | 60/645 |
| 2003/0005696 A1 * | 1/2003 | Wilson | 60/618 |
| 2007/0163754 A1 | 7/2007 | Dionne et al. | |
| 2009/0120618 A1 * | 5/2009 | Konig | 165/104.21 |

OTHER PUBLICATIONS

J. Bintoro et al., "A Closed-Loop Electronics Cooling by Implementing Single Phase Impinging Jet and Mini Channels Heat Exchanger," Applied Thermal Engineering, 2005, pp. 2740-2753, vol. 25.

M. Ellsworth, Jr. et al., "High Powered Chip Cooling—Air and Beyond," Electronics Cooling, Aug. 2005, vol. 11, No. 3, http://www.electronics-cooling.com/articles/2005/2005_august_article1.php, 5 pages.

C. Gao, "Experimental Study of the Ranque-Hilsch Vortex Tube," 2005, Eindhoven, http://alexandria.tue.nl/extra2/200513271.pdf, 159 pages.

E. Granryd et al., Refrigerating Engineering, Stockholm, http://www.energy.kth.se/courses/4a1601/Files/Pool%20boiling.pdf, 2005, pp. 8:18-8:25.

Honeywell, Genetron 245fa Applications Development Guide, 2000, 15 pages.

Promvonge et al., "Investigation on the Vortex Thermal Separation in a Vortex Tube Refrigerator," ScienceAsia 31, 2005, pp. 215-223.

L. Swanson, "Heat Pipes," CRC Handbook of Mechanical Engineering, 1998, pp. 4-260-261, 4-272.

J. Titus, "Liquid Cooler Chill Out," ECN Magazine, Oct. 2007, 4 pages.

M. Vogel et al., "Low Profile Heat Sink Cooling Technologies for Next Generation CPU Thermal Designs," Electronics Cooling, Feb. 2005, vol. 11, No. 1, http://www.electronics-cooling.com/articles/2005/2005_feb_a2.php, 11 pages.

Lee et al., Mechanical Energy from Low Temperature Heat using ORCS, Air Conditioning and Refrigeration Engineering, 1989, vol. 18, No. 1, pp. 29-35.

International Search Report and Written Opinion corresponding to International Application No. PCT/US2009/038543 dated Nov. 12, 2009, 11 pages.

* cited by examiner

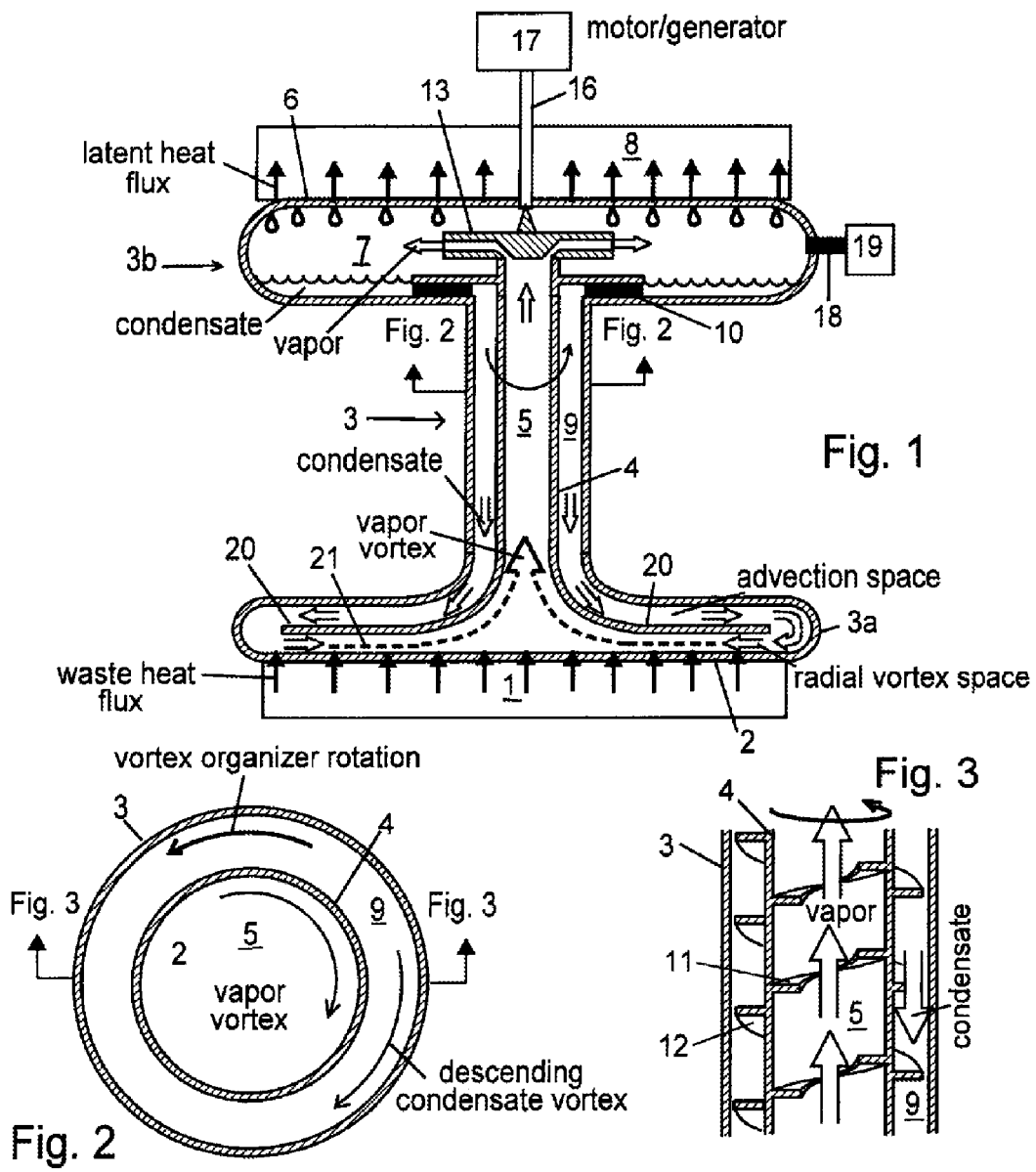

array of radial vortices in the radial vortex space motherboards in a data center

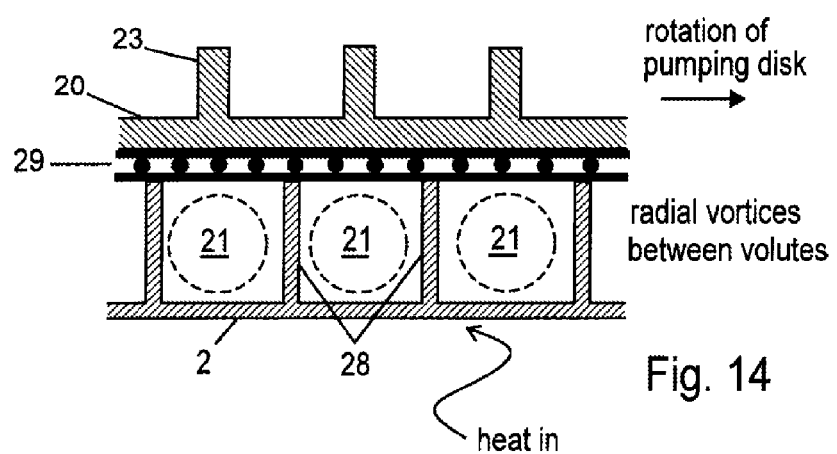
Fig. 14
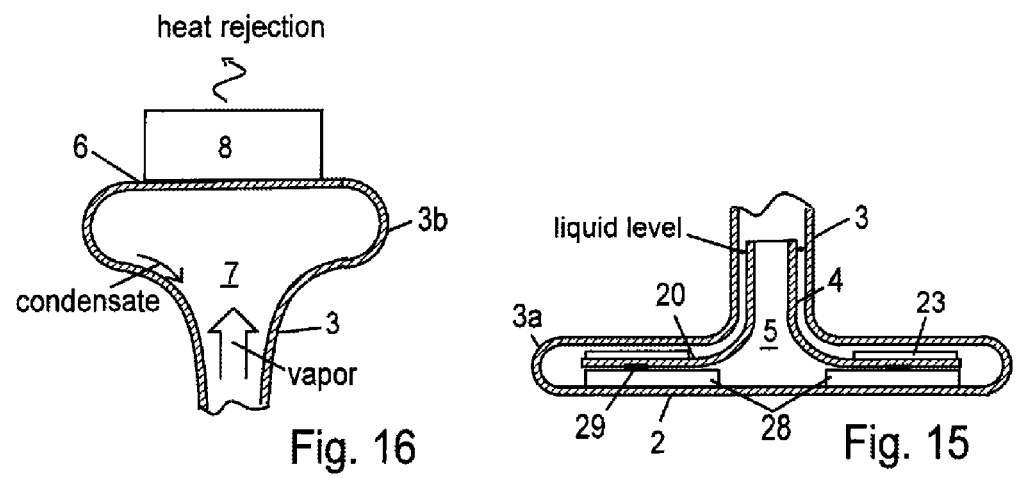
Fig. 16
Fig. 15

VAPOR VORTEX HEAT SINK

This application is a continuation of U.S. patent application Ser. No. 12/178,441 titled "VAPOR VORTEX HEAT SINK" filed Jul. 23, 2008, now allowed, which application claims the benefit of U.S. Provisional Patent Applications 61/043,919 filed Apr. 10, 2008 and 61/041,110 filed Mar. 31, 2008, all of which are incorporated herein by reference in their entirety for all intents and purposes.

BACKGROUND OF THE INVENTION

This invention relates to waste heat extraction by forced convection boiling, to means for preventing vapor bubbles at heating surfaces, and to organic Rankine cycles for electric power generation from waste heat.

Chip Cooling:

Waste heat from digital signal processors (DSPs) and other high heat flux electronic components (collectively "CPUs" herein) degrades performance. The task of extracting waste heat from CPUs consumes inordinate energy and is a major expense at data centers.

The CPU's surface area is small and the heat flux through that small surface area must be high to get rid of the heat. Adding fins to increase the surface area, and blowing air at the fins, cannot overcome the basic limitation of direct air cooling, which is its low heat flux. The diffuse distribution of molecules in air means that only a few molecules at a time can be in contact with a fin or other solid surface, so the heat transfer into the air is small, less than 1 W/cm$^2$ (on the surface area of the fins). If forcing is employed, to blow more molecules toward the surface, residence time of air molecules at the surface for heat transfer will be short. Theory predicts, and practical experience is confirming, that direct air cooling of CPUs will soon become extinct as high heat flux is increasingly demanded. Even with fins and forcing, the maximum chip heat flux with air cooling is less than 100 W/cm$^2$. Indirect liquid cooling is the preferred technology, having a chip heat flux up to 400 W/cm$^2$. See "High Powered Chip Cooling-Air and Beyond" by Michael J. Ellsworth, Jr. and Robert E. Simons, *Electronics Cooling* (August 2005) http://www.electronics-cooling.com/articles/2005/.

Forced convection immersion liquid cooling (without change of state from liquid to vapor) has a much greater heat flux than any air mode. The heat flux achievable on a fin with forced convection immersion is 50 W/cm$^2$ (square centimeters of fin area) which is fifty times more than jet impingement air cooling. Forced convection is a significant improvement over free convection immersion (where only buoyancy drives fluid flow) whose heat flux is only 1 W/cm$^2$—approximately the same as air jet cooling. Examples of forced convection liquid cooling are Roy, U.S. Pat. No. 7,055,531 (Jun. 6, 2006), a motor-driven centrifugal impeller disposed in a chamber above a CPU surface; Remsburg, U.S. Pat. No. 6,604,572 (May 16, 2000), which features thermosiphon convection in a chamber above the CPU, without mechanical pumping means; Wu et al., U.S. Pat. No. 6,894,899 (May 17, 2005), a motor-driven centrifugal impeller; Burward-Hoy, U.S. Pat. No. 5,442,102 (Aug. 15, 1995), a motor-driven centrifugal impeller; and Farrow, et al. U.S. Pat. No. 6,945,314 (Sep. 20, 2005), which is also a motor-driven centrifugal impeller. Perfluorinated coolants (also known as FC coolants), which are highly inert, are safe to use for direct liquid cooling of electronic components. Change of state for waste heat extraction can be done by pool boiling or forced convection boiling. Pool boiling has a heat flux limit of only 20 W/cm$^2$ which is inferior to forced convection immersion (50 W/cm$^2$). The problem is that vapor from the heated fin or other surface blocks heat flux into the liquid, and becomes superheated so it is harder to condense. Vapor nucleates at the heated surface and small bubbles coalesce there until the buoyancy of the aggregated bubble is enough to detach it from the surface. The absence of forcing means to sweep vapor off the heated surface as soon as it forms means that the vapor becomes an insulating pocket of superheated gas impeding the heat flux into the liquid coolant. Superheat must be extracted at the condensing end, which is a waste of cooling power. Examples of pool boiling for CPU cooling are Paterson, U.S. Pat. No. 5,390,077 (Feb. 14, 1995), a button-like clamp-on coolant tank having fins and an internal baffle directing vapor flow up and radially out along internal fins; and Searls, et al. U.S. Pat. No. 6,550,531 (Apr. 22, 2003), wherein vapor rises at the periphery of a chamber, condenses with fin air cooling, then drips at the center of a CPU.

A special class of pool boiling devices is the heat pipe, a hermetic vapor cycle in a tube, wherein a working fluid such as water evaporates at an evaporating end and the vapor rises in the pipe to a condensing end, where it condenses and discharges its latent heat to an external heat sink, such as ambient air or other cooling means. The heat pipe has no moving parts. To draw condensate back down to the evaporating end to complete the vapor cycle, wicking or capillary means are disposed at the inner wall of the heat pipe. The pressure within the heat pipe is approximately the vapor pressure at the desired operating temperature of the CPU. An example of a heat pipe for cooling a CPU is Tsai et al., U.S. Pat. No. 7,352,580 (Apr. 1, 2008), featuring a battery of slanted heat pipes, with finned tube heat rejection for the condensing end; and Herring et al., U.S. Pat. No. 7,352,579 (Apr. 1, 2008) with a heat pipe spring-loaded onto the CPU for improved conduction. Heat exchange between the vapor and the returning condensate should be avoided so that there may be heat flux from the hot chip to the heat rejection means as directly as possible. Heat pipe thermal conductivity is four times higher than copper.

Forced convection boiling is the best of all known cooling modes, having a heat flux over 100 W/cm$^2$. Again, the surface for this value is the heated surface, including fins, and not the chip surface. Vapor is continuously swept from the heated surface, which can be the interior of an indirect liquid cooling apparatus, and vapor is quickly replaced by the denser liquid, so heat transfer into the liquid is never impeded by an insulating bubble layer of superheated vapor. Forcing requires some forcing means, conventionally an agitator or a pump powered by an external motor, which advects the condensate.

Burward-Hoy, U.S. Pat. No. 5,441,102 (Aug. 15, 1995) teaches a motor-driven centrifugal pump disposed in a short chamber above the CPU as a replacement for the wicking capillary means of a heat pipe. Fluid flow in the Burward-Hoy device is down at the center of the evaporating end, over the center of the CPU, and then radially outward to the periphery, driven by the externally-driven centrifugal pump in the chamber, and then up to external heat rejection means. This is the opposite of the direction in a conventional heat pipe, where vapor rises in the center. Although Burward-Hoy mentions a heat pipe, what is described is a forced convection liquid cooling device employing no change of state. No condensing means are mentioned, and there appears to be no space for vapor to evolve. The backward fluid flow in Burward-Hoy would have vapor flowing up the periphery instead of up the center of the evaporating end of the heat pipe. Farrow et al. U.S. Pat. No. 6,945,314 (Sep. 20, 2005) also teach internal motor-driven pumping means for advecting fluid downward against the center of the CPU and then radially outward over the heated surface, like Burward-Hoy.

The disadvantage of this down-and-out flow in Burward-Hoy and Farrow et al. is that vapor, which would tend to form at the hottest part of the heated surface, over the center of the CPU, may become trapped in an insulating pocket over the hottest part of the CPU until buoyancy makes it rise up through the downward flow of liquid, engaging in heat exchange with the cooled fluid instead of the external heat rejection means of the heat pipe. Like Burward-Hoy, Farrow et al. do not mention condensation or any vapor cycle.

The Rankine Cycle:

The ideal Rankine cycle is a closed system (no mass flow in or out) in which thermal energy (heat) is input from the environment to a boiler, causing evaporation of a working fluid such as water. The vapor exports work to the environment, losing enthalpy by flowing through a turbine, and the remaining energy in the vapor at the turbine exhaust is rejected to the environment by a condenser. Work is imported from the environment to pump condensate from the condenser back into the boiler, renewing the mass flow cycle. In practice, there is a small amount of mass flow into the cycle in the form of make-up water because of losses at the condenser. FIG. 9 of the drawings shows a flow diagram of the conventional Rankine cycle.

The Organic Rankine Cycle:

Water is the usual working fluid for the Rankine cycle, in steam turbines for electric power generation, but the organic Rankine cycle uses an organic compound, such as a haloalkane, instead of water. The high molecular mass of organic compounds, compared to water, gives the organic molecules higher momentum at a given vapor temperature. The organic working fluid chosen should be environmentally benign, such as HFC-245fa, marketed by Honeywell as Genetron 245fa. At 25° C., saturated vapor of water has a density 287 times smaller than saturated vapor of HFC-245fa, so a compact Rankine cycle operating at low heat input temperature can be accomplished by using an appropriate organic working fluid. Advantages of organic Rankine cycle devices include (1) high cycle efficiency; (2) very high turbine efficiency (up to 85 percent); (3) low mechanical stress on the turbine; and (4) low rpm of the turbine allowing for direct drive of the electric generator without gear reduction. Power generation from low temperature waste heat is possible using an organic Rankine cycle, whereas a conventional steam cycle requires an input temperature very much higher, from combustion of fossil fuels or a nuclear heat source, in order to have satisfactory thermodynamic efficiency.

The Hermetic Rankine Cycle:

A totally hermetic Rankine cycle would not export or import energy in the form of work, nor would there be any mass flow in or out of the cycle during operation. Energy imported in the form of heat would flow through the device and be rejected at the condenser to the environment, as in a conventional Rankine cycle. An at least partially hermetic Rankine cycle, which conserves work within the cycle to power the pump, is an object of the present invention. Using an organic working fluid in the hermetic Rankine cycle would allow for an especially efficient forced convection waste heat extractor powered by heat flow alone. It is an object of the present invention to provide such an improved heat sink, and to provide means for extracting work from waste heat without any input of work from the environment.

SUMMARY OF THE INVENTION

The vapor vortex heat sink is a hermetic Rankine cycle device comprising an internal turbine and an internal pump; the turbine drives the pump. No external pumping means are necessary to sustain the cycle. Unlike conventional heat pipes, there are no wicking means, and there is minimal heat exchange between vapor and condensate during the cycle.

An organic working fluid allows for low temperature waste heat to power the internal turbine of the hermetic Rankine cycle, which in turn powers the internal pump which drives condensate into the boiler to renew the cycle.

Forced convection boiling couples a heat source, such as a CPU in a data center, to a remote heat sink, of conventional design and having high cooling power, by maximizing heat flux through the area available for heat transfer. Waste heat becomes latent heat in vapor, which swirls in an ascending vapor vortex within a vortex organizer disposed at the axis of a sealed casing. Some of this convective mass flow kinetic energy is stripped off in an internal turbine to power the internal centrifugal condensate pump. The centrifugal pump draws condensate down from the condensing end and drives it radially inward over the heated surface of the evaporating end to renew the vapor cycle. High shear and suction provides radial vortex conduits for vapor to escape the heating surface and convergently flow to the vapor space. Rapid condensation at a condensing surface served by a high cooling power ultimate heat sink sucks mass flow through the internal turbine.

Instead of running lines of cold liquid into the data center, and thus running the danger of condensate dripping on sensitive components, the waste heat is transported as latent heat by vapor in forced convective mass flow to a more convenient place for heat rejection.

In the preferred embodiment, saturated vapor flows into the condensing end of the vapor vortex heat sink and radially outward through vapor tubes as in Hero's steam engine, rotating the vortex organizer which is the internal turbine. The latent heat is extracted by a conventional heat sink having high cooling power. A vacuum due to condensation sucks more vapor through the vortex organizer and the vapor pipes, forcing mass flow and also rotating the vortex organizer in a self-sustaining manner, powered only by heat flow from the CPU to the heat sink.

Condensate flows by gravity in a descending condensate vortex down the outside of the vortex organizer along condensate runners. The potential energy of condensate in the condenser becomes kinetic energy also rotating the vortex organizer in the same direction as does the ascending vapor vortex and the vapor tubes. Axial counterflow of vapor up and condensate down powers the internal turbine and internal pump of the hermetic Rankine cycle. Use of an organic working fluid makes this an organic hermetic Rankine cycle.

After causing rotation of the vortex organizer in downward flow, condensate is pumped radially outward by a centrifugal pumping disk connected to the vortex organizer and disposed in the evaporating end. This disk is the internal pump of the hermetic Rankine cycle, and is powered by the internal turbine, which is the vortex organizer rotated by forced convective mass flow from the evaporating end to the condensing end of the hermetic casing. Rotational inertia of the disk is overcome by the torque imparted to the vortex organizer by the mass flow, assisted if necessary on startup by a small external startup motor. Condensate flows radially outward in an advection space against the upper surface of the disk, then rebounds from the periphery of the evaporating end and flows radially inward through the radial vortex space to a central aperture in the pumping disk, where it enters the vapor space at the center of the vortex organizer. Evaporation during this radially inward flow extracts waste heat, which is transported up the vapor space to the heat sink in the form of latent heat. Evaporation and the work of the pump drives mass flow in a continuous cycle. Mass flow is smooth because the turbulence is organized, like a hurricane. The self-sustaining forced convective mechanism of hurricanes, which is due to heat flow alone, is what sustains mass flow and powers the pump.

High shear in the radial vortex space below the pumping disk agitates the fluid against the heating surface and sweeps vapor away into radial vortex cores. Vapor does not form insulating bubbles on the surface as with pool boiling in a conventional heat pipe. Superheating of vapor is avoided by organized turbulence. Radial vortices in the narrow space, forced by disk rotation and sustained in coherence by the suction in the vapor space, provide sink flow conduits for vapor swept from the heated surface.

Forced convection between the evaporating end and the condensing end, in cyclonic axial counterflow of condensate and vapor, provides the mass flow to drive the internal turbine and the internal pump of the hermetic Rankine cycle. By using an appropriate working fluid at the desired working temperature, waste heat alone can drive forced convection boiling for powerful heat extraction and power generation.

Discussion focuses on the application to computer chip cooling, but the present invention also applies to all other waste heat extraction needs, such as, for example, internal combustion engine cooling, injection mold cooling, chemical reactor cooling, turbine exhaust steam cooling, and applications in food and beverage processing. It also applies to power generation from low temperature waste heat sources, such as Brayton cycle turbine exhaust at IGCC power plants.

BRIEF DESCRIPTION OF THE DRAWINGS

FIG. 1 shows a cross-sectional schematic view of the preferred embodiment of a vapor vortex heat sink according to the present invention.

FIG. 2 shows a cross-sectional view of the device shown in FIG. 1 looking down toward the heating surface 2.

FIG. 3 shows a cross-sectional detailed view of a portion of the central section of the device shown in FIG. 1, illustrating the axial counterflow of vapor and condensate.

FIG. 14 shows a detail cross-section of the pumping disk 20, its runners 23, the bearing assembly 29, and the radial volutes 28 of the heating surface 2.

FIG. 15 shows a detail of the evaporating end 3a of an alternative embodiment.

FIG. 16 shows a detail of the condensing end 3b of an alternative embodiment.

DRAWING REFERENCE NUMERALS

1—heat source
2—heating surface of the vapor vortex heat sink
39—hermetic casing
3a—evaporating end of the hermetic casing
3b—condensing end of the hermetic casing
4—vortex organizer
5—vapor space within the vortex organizer
6—condensing surface
7—vapor condensation chamber
8—conventional heat sink comprising means for heat rejection
9—condensate space
10—thrust bearing
11—vapor runner
12—condensate runner
13—reaction turbine, pivot pin assembly
14—vapor port
15—vapor tube
16—external drive spindle
17—external drive motor or generator
18—purge port for filling or evacuating the casing
19—regulating means for purge port, including pop—out in case of excess pressure
20—pumping disk
21—radial vortex between pumping disk and heating surface
22—pointed protuberance of the heating surface
23—centrifugally advecting runner on pumping disk
24—heat collector
25—heat fin
26—chip
27—board
28—radial volute
29—bearing assembly
a—a is the common axis of rotation of the vortex organizer, the pivot pin assembly, and the pumping disk

DETAILED DESCRIPTION OF THE PREFERRED EMBODIMENT

Figure 5:
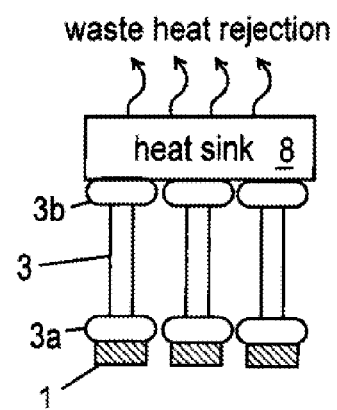
FIG. 5 shows a configuration of vapor vortex heat sinks ganged together and having a common ultimate heat sink 8.

FIG. 1 shows a cross-sectional schematic view of the preferred embodiment of the present invention. A heat source 1 such as a metal surface communicating thermally with a CPU communicates thermally with a heating surface 2 which is part of a hermetic casing 3, the casing having an evaporating end 3a and a condensing end 3b. The condensing end 3b comprises a condensing surface 6 in thermal communication with a conventional heat sink 8. The heat sink 8 could be a chiller or other high cooling power means for heat rejection to the environment known to the art of refrigeration. Or it could be a fin and tube condenser or a pool or pipe of water. Many other conventional heat sinks are known to the art and might be suitable as a heat sink 8, depending on the waste heat extraction application. The heat sink 8 is sized for the cooling power, conventionally measured in tons of refrigeration (1 ton of refrigeration=3517 watts), required by the heat load it serves. A plurality of vapor vortex heat sinks according to the present invention sharing a common heat sink 8 is shown in FIG. 5. The present invention provides means for optimal flow of waste heat from the heat source 1 to the heat sink 8 where heat rejection occurs at a convenient place. Coupling a high cooling power heat sink 8 to a small hot surface area is done by forced convection boiling in a hermetic Rankine cycle.

The casing 3 contains a working fluid for a vapor cycle. The working fluid is present in both liquid and vapor phases. Organic Rankine cycle working fluid has the advantage of high molecular mass for driving the turbine and thereby the pump of the hermetic Rankine cycle disclosed in the present invention. Examples of organic working fluids having low boiling points include butane, pentane, acetone, methanol, and refrigerants such as FC-87 from 3M. Water can also be the working fluid, preferably in a purified form to prevent the deposit of scale from repeated boiling and condensing cycles. The casing is hermetically sealed, and the pressure inside the casing 3 can be adjusted by means of a purge port 18 in order that the operating temperature of the vapor vortex heat sink is sufficiently high to avoid condensation of atmospheric water vapor on the outside of the casing.

Water may be preferred as a working fluid in some applications because it is readily available and has a high latent heat of evaporation ($h_{fg}$), so it can carry a large burden of waste heat from the heating surface 2 to the condensing surface 6 for extraction into the external heat sink 8. However, for power production, water is not preferred because it has low molecular weight and is not effective with a low temperature heat source. Noncondensible gases are purged from the casing 3 by means of the purge port 18 in order that condensation is not impeded by their presence. The purge port also provides means for introducing working fluid into the casing.

Figure 11:
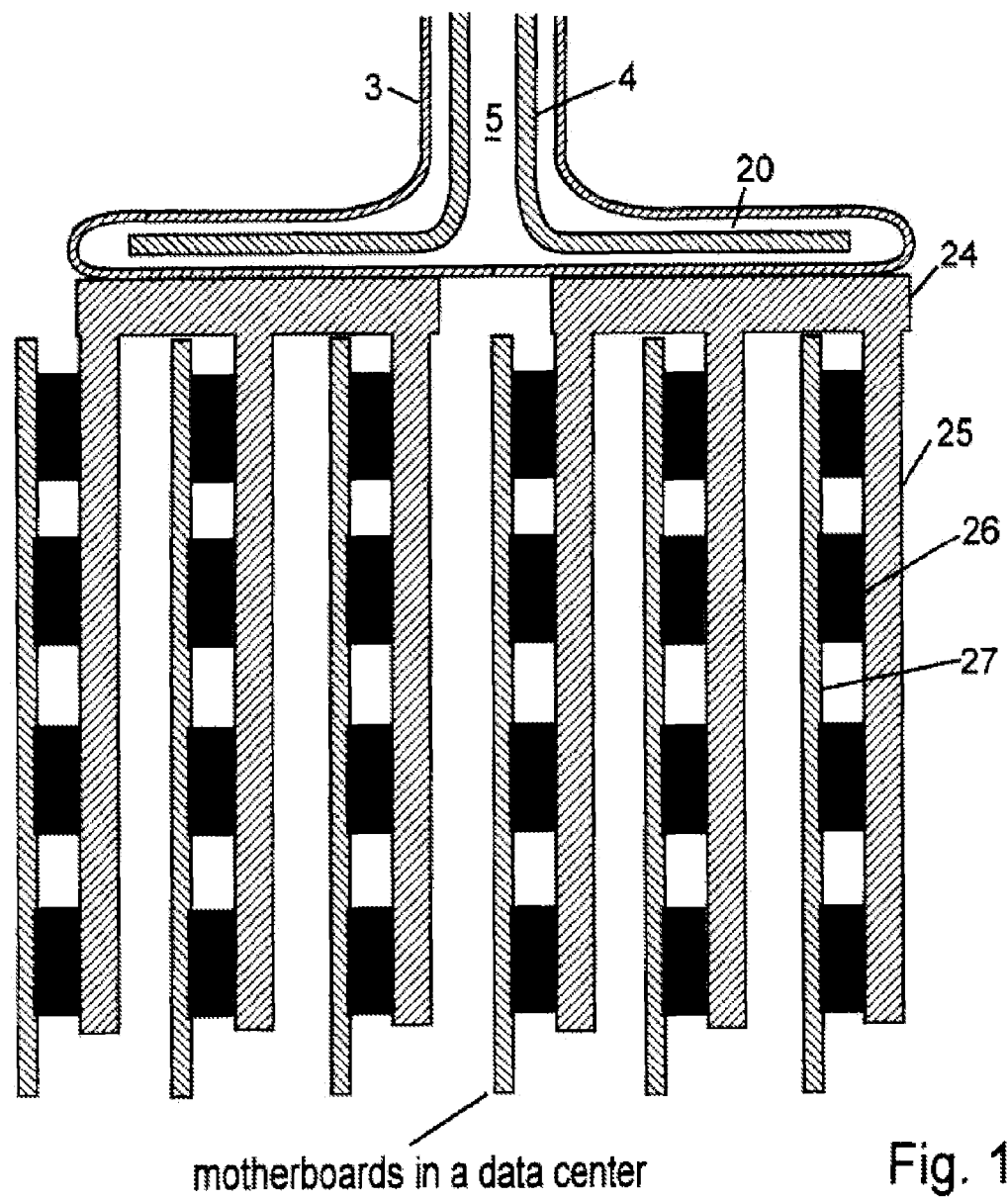
FIG. 11 shows means for connecting a number of vertical motherboards to a heat sink according to the present invention.

The device shown in FIG. 1 and FIG. 11 is the preferred embodiment for chip cooling because it can be readily adapted to existing CPU architecture at data centers. Alternatively, the heat source 1, such as a CPU, could be disposed inside the evaporating end 3*a* of the casing 3 and under the pumping disk 20 for direct cooling in turbulent flow. This alternative embodiment is intended to be covered by the claims. Using the teachings of the present invention, motherboards and cards may be fabricated with means for submersion of electronic components in a bath of turbulent dielectric working fluid. In that case, heat exchange would be direct from the component to the working fluid, without an intermediate heating surface 2. The heating surface 2 is not an essential element but, along with this alternative, is another means for transferring waste heat from the heat source 1 to the cooling fluid in the casing 3 and ultimately to the heat sink 8.

An approximately cylindrical vortex organizer 4, having a vapor space at its core and comprising at least one internal vapor runner 11 engaging vapor in the vapor space, is disposed within the casing 3. Suitable means separate the vortex organizer 4 from the casing 3 to allow for free rotation of the vortex organizer and to define an annular condensate space between the casing and the vortex organizer, the condensate space providing means for flow of condensate from the condensing end 3*b* to the evaporating end 3*a* of the casing 3 so that the vapor cycle may be continuous. Shown here as means for separation is an annular thrust bearing 10 which engages a flange on the vortex organizer and a surface of the casing; the flow of condensate also serves to lubricate the thrust bearing. FIG. 14 and FIG. 15 show alternative means for separating the rotatable vortex organizer from the casing.

The vortex organizer axis of rotation a-a is at the centerline of the casing which is also the axis of rotation of a vapor vortex from the evaporating end to the condensing end. The vapor vortex provides a conduit for flow of low enthalpy saturated vapor of the working fluid from the evaporating end to the condensing end. Entrained mist is spun out of the vapor vortex.

A vapor space 5 is at the center of the vortex organizer 4. A detail of the vortex organizer 4 and the central portion of the casing 3 is shown in FIG. 3. The vortex organizer 4 is connected to a pumping disk 20 and is the internal turbine of the hermetic Rankine cycle of the present invention. See FIG. 13. The vortex organizer 4 sustains axial cyclonic counterflow of vapor and condensate and thermally insulates the vapor and condensate from each other, and it also extracts work from convective mass flow by means of its runners 11, 12 to drive the internal pump 20. The runners 11, 12 provide means for rotating the vortex organizer due to impingement of working fluid during flow between the evaporating end and the condensing end of the casing.

Mass flow through the vapor space 5 impinges the vapor runners 11 and thereby imparts torque about the axis a-a to the vortex organizer 4. An organic working fluid, such as HFC-245fa, is preferred because its vapor has high density and therefore convective mass flow through the vapor space causes high momentum transfer from the vapor of the working fluid to the vortex organizer 4 and through it to the pumping disk 20. By pushing the turbine, some of the vapor of the working fluid loses enthalpy and partially condenses. Condensate then flows along the vapor runners 11 back to the radial vortex space between the pumping disk 20 and the heating surface 2 where it is sheared and re-vaporized. Vapor which does not condense against the runners, including turbine exhaust and the low enthalpy saturated vapor core of the vapor vortex, continues to flow to the condensing end 3*b* of the casing.

Entrained condensate in the vapor stream is centrifugated by the vapor vortex to the wall of the casing 3, FIG. 15 and FIG. 16, or to the wall of the vortex organizer 4 as shown in FIG. 1. Before the vapor stream enters the condensing end 3*b* it has been demisted. Centrifugal elimination of condensate avoids subcooling of entrained condensate, which would waste cooling power.

Vapor vortex rotation centrifugally separates the convective mass flow into a high enthalpy vapor vortex wall, which engages the vapor runners 11, and a vapor vortex core of low enthalpy saturated vapor of the working fluid, which goes to the condensing chamber 7 where it discharges its latent heat to the heat sink 8. The vapor vortex wall does work and as it impinges the vortex organizer and causes it to rotate about the axis a-a. In doing work, it loses enthalpy, and the saturated vapor remaining joins the vortex core.

The vapor is not superheated, because the turbulence in the radial vortex space prevents vapor from lingering at the heating surface. The high enthalpy fraction of its Maxwellian speed distribution of molecules has been forced to do work, and thereby lose enthalpy and become low enthalpy saturated vapor. The working fluid which arrives at the condensing surface 6 is easy to condense, so the cooling power of the heat sink 8 is not wasted.

Figure 9:
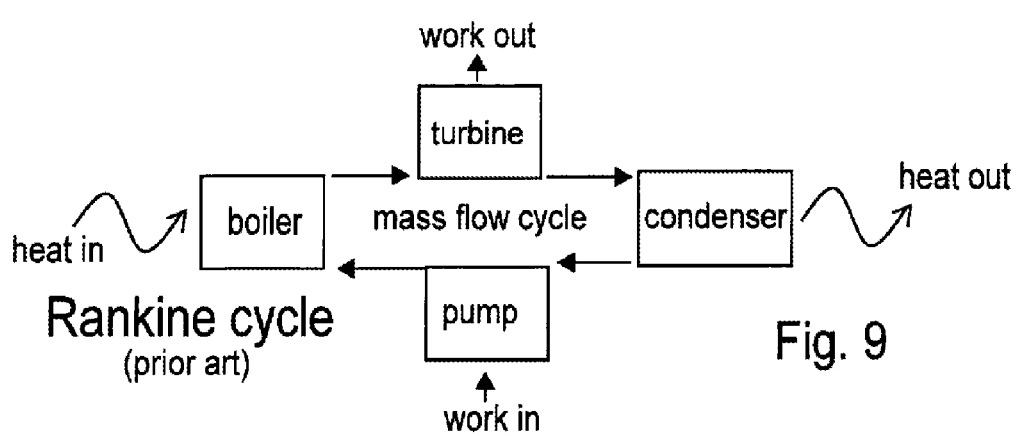
FIG. 9 shows a flow diagram of a conventional Rankine cycle.
Figure 13:
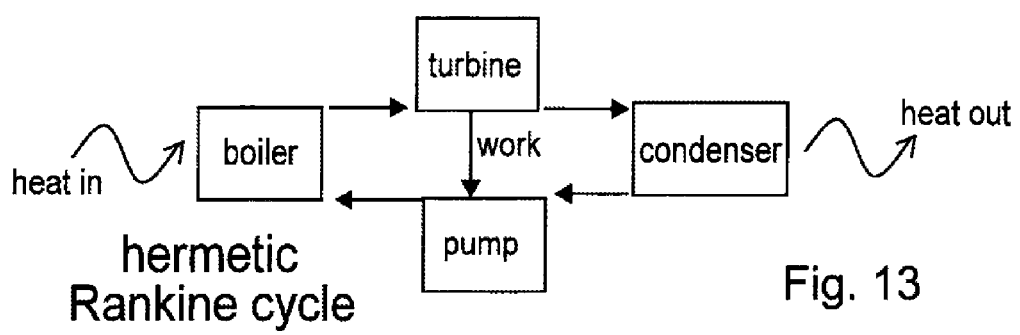
FIG. 13 shows a flow diagram of the hermetic Rankine cycle disclosed in the present invention.

Compare the flow diagram of the conventional Rankine cycle, shown in FIG. 9 with the flow diagram of the hermetic Rankine cycle of the present invention, shown in FIG. 13. The work of the turbine is conserved in the cycle of the present invention to run the pump, whereas in the conventional Rankine cycle the pump is run by external power.

The centrifugal pumping disk 20 is connected to the vortex organizer 4 and extends approximately parallel to the heating surface 2 within the evaporating end 3*a* of the casing 3. The pumping disk 20 is spaced apart from the casing 3 so as to define (1) an advection space above it, which communicates with the condensate space around the vortex organizer and contains the working fluid being advected by the pumping disk radially outward from the axis a-a, and (2) a radial vortex space below it, which communicates with the advection space and also with the vapor space 5 through an aperture at the center of the pumping disk.

There is a continuous cyclic flow path for working fluid from the condensing space 7, through the condensate space 9, through the advection space, through the radial vortex space, through the vortex space 5, and through the reaction turbine 13 into the condensing space 9.

Condensate advected by the centrifugal pumping disk 20 flows around the edge of the pumping disk against the wall defining the periphery of the evaporating end 3a and into the radial vortex space, where it becomes vapor. This is shown by arrows in FIG. 1. The radial vortex space provides a turbulent convergent flow passage for working fluid from the periphery of the evaporating end 3a to the vapor space 5 which is a low pressure sink due to suction due to condensation at the condensing end 3b. The turbulence in the sheared working fluid between the pumping disk 20 and the heating surface 2 comprises a radial array of coherent sink flow conduits, which are the radial vortices. See FIG. 7.

The pumping disk 20 preferably comprises a radial array of spiral runners 23 on its top surface which insure that rotation of the pumping disk drives working fluid radially inward through the radial vortex space between the pumping disk and the heating surface 2 thereby drawing more condensate down from the condenser through the condensate space 9 and the advection space. See FIG. 10 for a detail of the runners 23 of the pumping disk 20. Alternatively, a pitted upper surface of the pumping disk, or scooping runners on the lower surface of the pumping disk, could be the means for insuring that rotation of the pumping disk advects working fluid radially inward through the radial vortex space to the vapor space 5.

Rotation of the vortex organizer may be initiated on startup by the assistance of an external drive motor 17 temporarily connected to the vortex organizer 4 by a drive spindle 16 connected to a pivot pin assembly 13, which is a reaction turbine. See FIG. 6. Suitable sealing means between the casing 3 and the drive spindle 16 prevent leakage of working fluid and intrusion of noncondensibles. The drive spindle 16 could connect to a generator instead of a motor 17 so that waste heat would produce electricity in a partially hermetic Rankine cycle.

Figure 6:
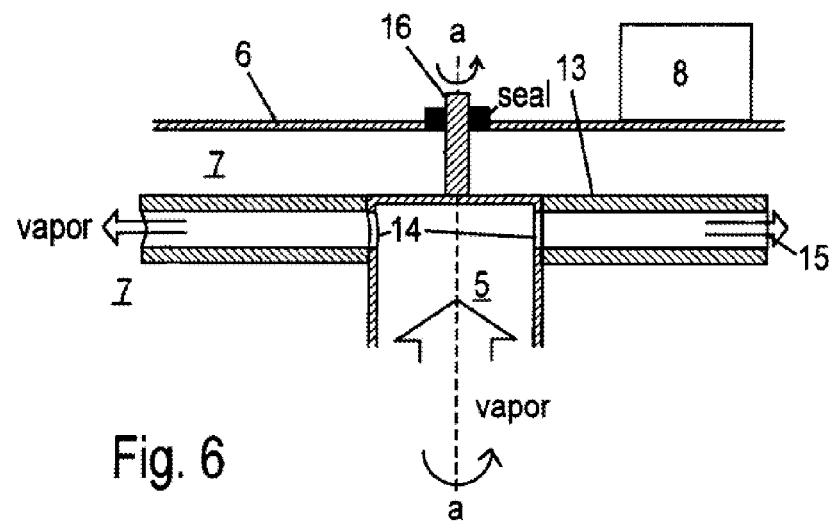
FIG. 6 shows a detail of the pivot pin assembly 13.

The alternative embodiment shown in FIG. 15 and FIG. 16 shows no drive spindle 16 and is purely for waste heat extraction. The vapor vortex from the vortex organizer extends into the condensing space 7 without going through a reaction turbine 13. However, the alternative embodiment could also comprise a reaction turbine 13 disposed in its condensing end and connected to a drive spindle as shown in FIG. 6, and it could also comprise a drive spindle connected to the vortex organizer or the pumping disk for mechanical assistance on startup.

Once the heat flow between the heat source 1 and the heat sink 8 has produced enough cyclonic axial counterflow to sustain rotation of the vortex organizer 4, the external motor 17 could be disconnected and a generator connected to the spindle 16 to make use of whatever energy is left over after the vortex organizer 4 has enough angular momentum to sustain a continuous waste heat cycle. Suitable means for regulating the rotation of the drive spindle could be connected to it, to boost its rotation when waste heat flow wanes or to brake its rotation when waste heat flow waxes. The drive spindle 16 also provides means for detecting whether the vortex organizer 4 is rotating properly.

It can be seen that the turbine and the pump of a hermetic Rankine cycle are a single connected unit, such that rotation of the turbine rotates the centrifugal pump, and no work from outside the system is needed to sustain the cycle, unlike the conventional Rankine cycle. If an internal turbine, such as the reaction turbine 13, were connected to an external device, such as a generator, the Rankine cycle would be partially hermetic because some work is exported, but nevertheless it would be hermetic because no work is imported while the cycle is in operation. The work of the internal turbine (the vortex organizer 4 and, in the preferred embodiment, the reaction turbine 13 connected to it) is conserved in the cycle, at least partially, and powers the internal pump (the pumping disk 20). This self-sustained internal pump drives forced convection boiling so as to transfer waste heat, in the form of latent heat, some considerable distance away from a heat source to a high cooling power heat sink where heat rejection can take place.

No work is imported except on startup, through the motor 17 and drive spindle 16. Once the cycle is underway, there is no work input, and there may even be work output through the drive spindle 16 connected to the armature of a generator. The Rankine cycle is hermetic not only with respect to conservation of mass, as a closed system, but also as to conservation of energy in the form of work, as shown in FIG. 13. Energy in the form of heat flows smoothly through the cycle from the heat source 1 to the heat sink 8, and thereby causes mass flow which drives the turbine and thereby drives the pump which sustains the cycle.

At the center of the evaporating end 3a, vapor from the heating surface 2 or from the walls of radial vortices 21 goes into a vapor space 5 at the core of the vortex organizer 4. The vapor flows through the vapor space 5 to one or more vapor ports 14 near the top of the vortex organizer 4 and then exits the vapor space through curved vapor tubes 15 communicating with the vapor ports 14. Said vapor ports and vapor tubes are comprised in a pivot pin assembly 13 which is shown in detail in FIG. 6. The pivot pin assembly provides a reaction turbine 13, like Hero's steam engine, which in the preferred embodiment causes rotation of the vortex organizer 4. This is explained below under the discussion of FIG. 4.

Vapor exiting the vapor tubes 15 enters the condensation chamber 7 at the condensing end 3a due to low pressure therein. Low pressure is caused by condensation, which is caused by the high cooling power heat sink 8 extracting latent heat from the vapor and causing it to change state back to condensate, which is the liquid phase of working fluid.

Liquid working fluid has a much lower specific volume (cubic meters per kilogram of mass, $m^3/kg$) than the vapor phase. Vapor condenses against the condensing surface 6, which is cooled by the heat sink 8, and the volume shrinks, drawing more vapor into the condensing chamber 7 through the vapor tubes 15 and causing the reaction turbine 13 to turn. The heat sink 8 by its cooling power maintains low pressure in the condensation chamber 7, and low pressure draws vapor through the vapor space 5 away from the heating surface 2 through the radial vortices in the radial vortex space where the working fluid is sheared between the pumping disk 20 and the heating surface 2. Flow of vapor through the vapor space 5 makes way for more vapor to evolve at the heating surface 2 and prevents vapor from becoming superheated at the heating surface and therefore harder to condense. Shown in FIG. 1 is a very short distance between the heating surface 2 and the condensing surface 6, but the distance could be any length necessary to connect a small heated surface 1 with a high cooling power heat sink 8 located in a convenient place for large heat rejection.

In contrast to conventional heat pipes, no capillary or wicking means are used to cause flow of condensate from the condensing end to the evaporating end. An internal pump, the pumping disk 20, advects the condensate from the condensing end 3b through the condensate space 9 into the advection space of the evaporating end 3a then through the radial vortex space to the vapor space 5 at the axis of rotation a-a of the vapor vortex. Heat exchange between the condensate and the vapor in the vicinity of the evaporating end is minimized in the preferred embodiment by the continuous interior wall of the vortex organizer defining a condensate space all the way to the condensing end, so that heat is transported from the heat source to the heat sink with minimal recursion of heat through the cycle. There is recursion of energy, in the form of work from the turbine to the pump, but not in the form of heat.

Condensate that is advected by the pumping disk 20 radially out to the periphery of the evaporating end 3a of the casing 3 rebounds and flows radially inward from the periphery of the evaporating end 3a over the heating surface 2. Heated working fluid converges in high shear induced by the rotation of the pumping disk toward the vapor space 5 at the center of the vortex organizer 4. In this flow path, condensate becomes vapor due to heat exchange with the heating surface 2. Vapor cannot linger and superheat in bubbles at the heating surface because of the high turbulence, and due to its lower density must make way for fresh condensate to occupy the heating surface. Vapor in the high shear between the pumping disk 20 and the heating surface 2 becomes rolled up into radial vortices 21 which provide sink flow conduits into the vapor space 5. See FIG. 7.

As previously stated, heat exchange could also be with an internal heat source by direct liquid cooling, in an alternative embodiment comprising chips in a turbulent bath of dielectric working fluid, such as FC-87, within the hermetic casing. This provides an alternative for future chip design, provided that appropriate sealing means are employed to maintain a hermetic casing.

The vortex organizer 4 separates the vapor space 5 and the condensate space 9, and is preferably made of insulating material having low density. Runners 11, 12 on the vortex organizer 4 are impinged by the cyclonic axial counterflow of vapor and condensate, and thereby provide means for rotating the vortex organizer. The torque due to said impingement is shown by the curved arrow in FIG. 2. The rotation of the vortex organizer rotates the centrifugal pumping disk 20 attached to it and also serves to organize the axial counterflow of condensate and vapor, so that these flows do not interfere with each other, and so that there is minimal heat exchange between vapor and condensate which would short-circuit the condensing end 3b and thereby reduce the heat flow between the heat source 1 and the heat sink 8.

FIG. 2 shows a detail cross-section of the vapor space 5 and the condensate space 9 and the torque on the vortex organizer 4 due to impingement of working fluid in cyclonic axial counterflow through these spaces. Vortex organizer torque could also be assisted by external drive means 16, 17, if necessary, such as on startup, as explained above. A torque could be added from means disposed in the condensing chamber 7, such as a reaction turbine 13 connected to the vortex organizer. The preferred embodiment is a device, shown in FIG. 1, which uses vapor impingement on runners inside the vortex organizer, condensate impingement on runners outside the vortex organizer, a connected reaction turbine 13 which is the pivot pin assembly, and a startup motor 17—a total of four means for rotation. Any one would be sufficient. The drive spindle 16 of the startup external drive means could, once the waste heat is driving cyclonic axial counterflow, connect to a generator in place of the startup motor and thereby function as an armature to produce electricity from waste heat. Such a connection would also provide means for regulating the rotation of the drive spindle, braking it or impelling it as required to maintain a steady flow of working fluid.

FIG. 3 shows a detail cross-section of the vortex organizer 4 and its runners 11, 12. The flow of vapor and of condensate are shown by the arrows. Vapor flows through a vapor space 5 at the core of the vortex organizer 4. Preferably the vapor has a partially unobstructed path at the core of the vapor space 5. Low enthalpy saturated vapor, which is less dense (has a higher specific volume) than high enthalpy saturated vapor, concentrates in the unobstructed path while high enthalpy saturated vapor at the vapor vortex periphery is forced to do work during its ascent and thereby to lose enthalpy pushing the vapor runner 11. Organic working fluids are preferable for stripping work to the pump because they have high molecular mass and therefore high molecular momentum at a low input temperature, unlike water.

The vapor entering the vapor space 5 will have a Maxwellian speed distribution comprising a fraction of high velocity molecules (the high enthalpy fraction) and a fraction of low velocity molecules (the low enthalpy fraction) all mixed together, according to the kinetic theory of gases. Vortex rotation in the vapor space 5 inside the vortex organizer 4 centrifugally separates the low and high enthalpy fractions because of their density difference. The high enthalpy fraction impinges and does work turning the vortex organizer, thus losing enthalpy. There is also some kinetic energy added to the vapor due to the suction from the condensing end 3b, due to condensation of vapor there by the high cooling power heat sink 8. Some of the vapor enthalpy thus becomes work in an internal turbine. Low enthalpy saturated vapor, including the exhaust from this turbine, goes to the condensing end. Low enthalpy saturated vapor is easier to condense than high enthalpy saturated vapor. Stripping energy to do the internal work of the pump of the hermetic Rankine cycle allows for the present invention to be powered by waste heat alone.

Shown is a spiral vapor runner 11 disposed within the vortex organizer such that working fluid impinging on the vapor runner 11 as it flows through from the evaporating end to the condensing end causes the vortex organizer to rotate as shown. More than one vapor runner 11 could be on the vortex organizer 4. Or the vortex organizer could comprise rugose walls facing the vapor space 5. Note that the rotation of the vortex organizer, which is shown by the curved arrow, is assisted both by the downward flow of condensate in the condensate space 9 impinging the condensate runner 12 and by the upward flow of vapor in the vapor space 5 impinging the vapor runner 11.

Figure 4:
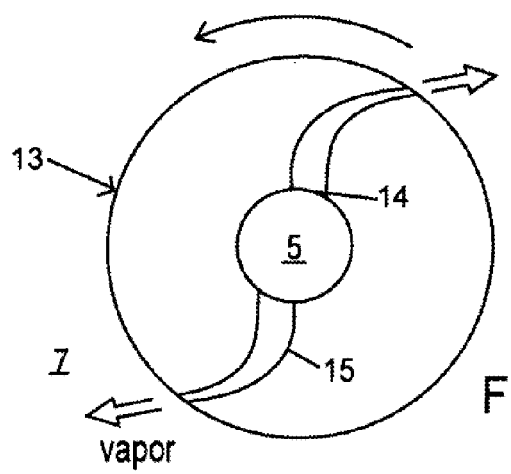
FIG. 4 shows a detail of a portion of the condensing end of the device shown in FIG. 1.

FIG. 4 shows a top cross-sectional view of the pivot pin assembly 13 which comprises additional means for imparting torque to the vortex organizer: a reaction turbine. In the preferred embodiment shown in FIG. 1, the pivot pin assembly and reaction turbine 13 are connected to the vortex organizer. Vapor leaves the vapor space 5 and exits vapor ports 14 in the vortex organizer 4. Curved vapor tubes 15, which are channels in the pivot pin assembly 13, discharge vapor into the condensation chamber 7. A vacuum in the condensation chamber 7 is caused by the heat sink 8 (not shown), which causes vapor to condense and shrink in volume. Vapor pulled through the vapor ports 14 and the curved vapor tubes 15 by this vacuum causes rotation of the vortex organizer 4. This is similar to Hero's steam engine, a reaction turbine. Condensation in the condensation chamber 7 also draws more vapor through the vapor space 5 in the vortex organizer 4, and thereby causes rotation of the vortex organizer as this vapor impinges on the runners 11 in the vapor space. Alternatively, the reaction turbine 13 could be separate from the vortex organizer and could provide additional means for driving the vapor vortex. The vortex organizer would drive the vapor vortex from the evaporating end, and the reaction turbine would independently drive the vapor vortex from the condensing end. Between the vortex organizer and the reaction turbine driving its two ends, the vapor vortex would centrifugate condensate out to the wall of the casing 3 and thereby de-mist the saturated vapor entering the condensation chamber 7.

FIG. 5 shows a plurality of vapor vortex heat sinks in thermal communication with a common high cooling power heat sink 8. Ganging of devices according to the present invention allows for economies of scale, since the ultimate heat sink 8 could be a high cooling power device known to the art which could handle many kilowatts of heat rejection. The present invention allows for coupling such a strong heat sink to a number of small heated surface areas such as digital signal processors (DSPs) or CPUs in a data center. The ultimate means for heat rejection could be outside of the building, exhausting waste heat to the environment by suitable means known to the art of heat exchangers. The waste heat rejected by the heat sink 8 could be converted at least partially into electricity by means of another device according to the present invention wherein the spindle 16 is connected to a generator 17 as shown in FIG. 1.

FIG. 6 shows a side view detail of the reaction turbine in the pivot pin assembly 13. The pivot pin assembly can be fabricated in two halves, which when fitted together define a plurality of spiral channels, which are the vapor pipes 15. Feed to the vapor pipes is at the axis of rotation a-a of the pivot pin assembly 13, as in a conventional centrifugal pump. The axis a-a is also the axis of rotation of the vortex organizer 4 and of the pumping disk 20. The vortex organizer 4 connects to the pivot pin assembly 13 and rotates along with it, as does the pumping disk 20 which is connected to the vortex organizer 4. The reaction turbine provided by the pivot pin assembly 13 could be also be disconnected from the vortex organizer 4 such that the work of the reaction turbine 13 rotates the drive spindle 16 and thereby rotates the armature of a generator 17. A conventional heat sink 8, which could be of many types known to the art, provides means for heat rejection and thereby drives cyclonic axial counterflow of condensate and vapor within the casing 3.

Suitable means for regulating the rotation of the drive spindle 16 would allow the drive spindle to be operated under varying heat load conditions. For example, on startup, a motor connected to the drive spindle 16 would drive rotation of the vortex organizer 4 until mass flow through the vapor space is sufficient to drive the vortex organizer alone. If heat load begins to decrease, such that the vortex organizer slows, the drive spindle provides means for boosting its rotation so it does not stall. If heat load becomes very high, the motor/generator 17 could switch to generator mode and provide braking.

The drive spindle 16 is shown extending out of the condensing end 3b of the casing, with a seal between the drive spindle and the casing to exclude intrusion of noncondensibles and loss of working fluid. The drive spindle is shown connected to the reaction turbine 13. Alternatively, the drive spindle could extend from the evaporating end 3a of the casing and be connected to the vortex organizer 4.

Figure 7:
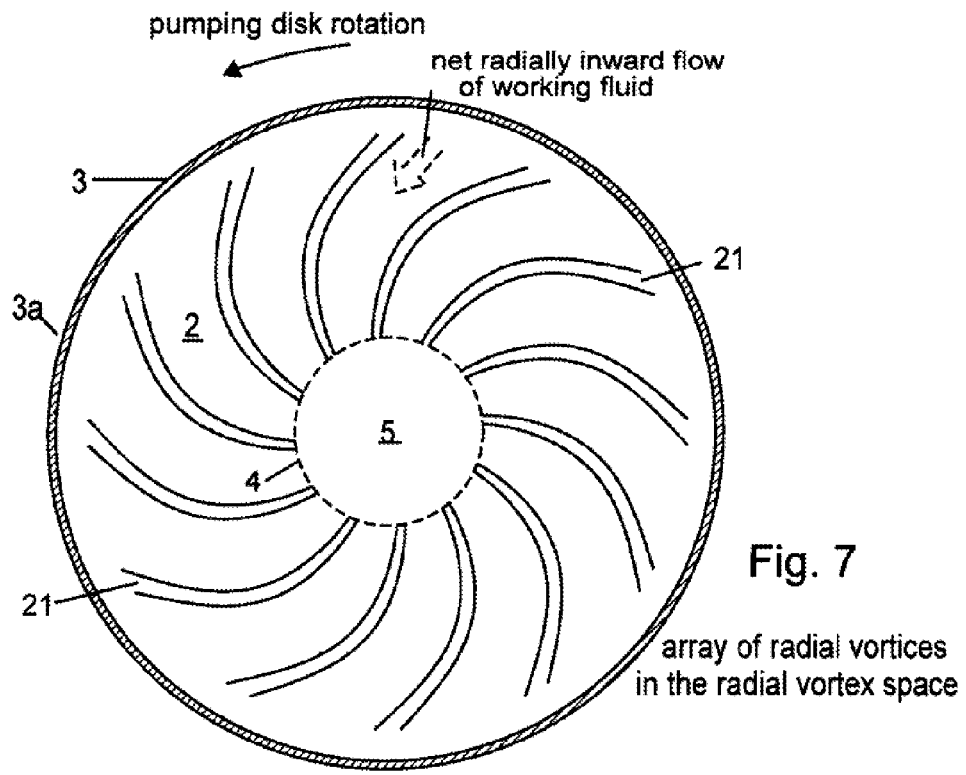
FIG. 7 shows a top view of the flow in the radial vortex space between the pumping disk 20 and the heating surface 2, and shows the array of radial vortices 21 in the anisotropic turbulence.

FIG. 7 shows a top view of the convergent flow in the space between the heating surface 2 and the pumping disk (invisible) to the vapor space 5. An array of radial vortices 21 curve from the periphery of the heating surface 2 into its center, which is the commencement of the vapor space 5 within the vortex organizer 4 shown by dotted lines. The flow of liquid is radially inward to the vapor space 5 due to the work of the pumping disk 20, which first advects condensate radially outward as previously described and performs the function of an internal centrifugal pump in a hermetic Rankine cycle. See FIG. 9. Condensate advected radially outward by rotation of the pumping disk 20 and its runners 23 rebounds from the periphery of the evaporating end 3a of the casing 3 and flows radially inward to the vapor space 5. Condensate in the turbulent flow between the heating surface 2 and the pumping disk 20 is spun against the heating surface 2 by the radial vortices, sweeping vapor away from the heating surface 2 and into the cores of the radial vortices 21 due to the lower density (higher specific volume than liquid) of vapor in swirling flow.

Flow of vapor in the space between the heating surface 2 and the pumping disk 20 is also radially inward to the axis a-a, but through the cores of the radial vortices. Low pressure in the vapor space 5, which communicates with the low pressure in the condensing end 3b, sucks vapor through the radial vortices 21 and into the vapor vortex in the vapor space 5. Although high shear and high turbulence exists between the heating surface 2 and the pumping disk 20, the turbulence is anisotropic and has organized features, like a tornado. Radial vortices 21, which are spoke-like tornadoes in the organized turbulence of the narrow space between the shearing pumping disk and the heating surface, provide coherent sink flow conduits for vapor to go from the heating surface 2 into the vapor space 5. Turbulence in this narrow space sweeps nucleated vapor from the heating surface 2 and thereby prevents vapor from accumulating, superheating, and blocking heat transfer into the liquid working fluid.

Figure 8:
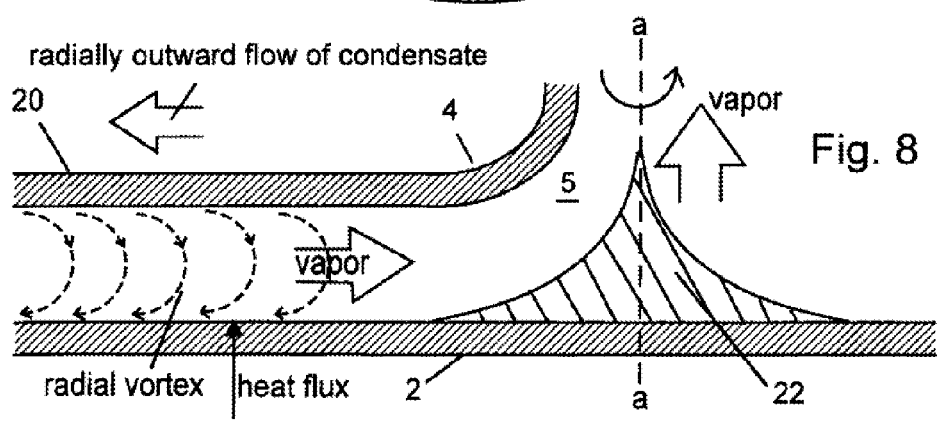
FIG. 8 shows a detail of the center of the heating surface 2 and the vapor space 5.

FIG. 8 shows a detail of the center of the heating surface 2 and the vapor space 5. Flow of cold condensate is radially outward from the axis a-a above the pumping disk 20 which is attached to the vortex organizer 4 and rotates along with it in the direction shown by the arrow.

Bubble accumulation at the heating surface 2 is minimized because hot liquid, and any evolved vapor, is swept into the radial vortices 21 which are shown in FIG. 7. Vapor and hot liquid both have lower density (higher specific volume) than condensate, and therefore they concentrate at the radial vortex cores, away from the heated surface 2, thus allowing more cooled condensate to replace heated condensate at the heated surface. The radial vortices 21 between the heating surface 2 and the pumping disk 20 provide means for sweeping nucleated vapor bubbles from the heating surface.

Rolled up into the radial vortices 21, the heated condensate is subject to the low pressure gradient through the vortex cores to the vapor space 5. The low pressure is caused by the condensation of vapor at the condensing end 3b at the other end of the casing 3, and by the rotation of the vortex organizer 4. Vapor evolves due to this low pressure gradient as well as by the heat transferred from the heated surface 2. The radial vortices 21 shown in FIG. 7 provide tubular surfaces for vapor to evolve. Instead of nucleating and sticking to the heated surface 2, vapor comes from a liquid surface under local low pressure and is continuously advected into the vapor space 5 through the coherent sink flow conduits provided by the array of radial vortices.

A liquid surface in the vapor space 5 is another location for vapor to evolve. A pointed protuberance in the heated surface 2 is shown as an optional but preferred feature, to avoid any dead spot in fluid flow where vapor might form an insulating pocket against the heated surface. It would be advantageous to make the pointed protuberance 22 out of highly conductive material such as copper or silver because it is disposed over the center of the CPU where there is the most heat flux.

However, see FIG. 11, where no pointed protuberance would be used because the center is not the hottest portion.

Because of these means for sweeping nucleated bubbles away from the heating surface, and these means for advecting vapor through radial vortices to the vapor space 5, there will be a layer of liquid working fluid at the heating surface 2 instead of a layer of insulating bubbles becoming uselessly superheated. Thus the full benefits of forced convection boiling over pool boiling in indirect liquid cooling are realized in the present invention.

Direct cooling could also be practiced in the same device, wherein the heating surface is the heat source itself. Suitable working fluids for direct liquid cooling include dielectric compounds such as FC-87.

A change of state, producing vapor, is shown because forced convection boiling provides the highest possible heat flux. However, the same device could also operate but much less effectively without change of state in an all-liquid convective cycle. The heated liquid, which is less dense than the cooled liquid coming into the radial vortex space, is rolled up into radial vortices and goes up the vapor space due to its lower density. The heated liquid is cooled by heat exchange with the heat sink, becomes denser, and descends by gravity, rotating the vortex organizer by the condensate runners 12 in the condensate space.

FIG. 9 shows a flow diagram of the conventional Rankine cycle. This is a well-known thermodynamic concept used in electric power generation. A heat source causes evaporation of a working fluid, such as water, in a boiler, and the steam from the boiler drives a turbine. Work is done on the environment by the turbine. The steam loses enthalpy doing work and a saturated vapor comprising some condensate is condensed in a condenser, such as a shell-and-tube heat exchanger. The condenser comprises means for rejecting heat into the environment, such as a cooling tower. The condenser also improves the efficiency of the cycle by sucking vapor through the turbine as vapor condenses. The working fluid, now a liquid condensate, is reintroduced to the boiler by the work of a pump. The pump is powered by energy imported from the environment, and this parasitic energy detracts from efficiency. So it can be seen that the conventional non-hermetic Rankine cycle has a simultaneous heat flow and work flow through it. The present invention differs from the conventional Rankine cycle because the work of the turbine (the vortex organizer 4) is conserved within the cycle to drive the pump (the pumping disk 20).

Meacher, et al. U.S. Pat. No. 4,362,020 (1982) disclose an organic Rankine cycle generator using Freon (trichlorotrifluorethane) as a working fluid operating with a boiler temperature of 110° C. (saturation pressure of 5.5 bar) and a heat sink at 35° C. There are two pumps, an internal feed pump 16 connected to the turbine and an external booster pump 40 which is necessary to provide net positive suction head for the internal pump (3:36, 49-51; see also claim 15 (6:15-35), which says that the second pump does not operate during the Rankine cycle). Meacham does not show a hermetic Rankine cycle and does not anticipate the present invention because work is imported to run his booster pump 40 to sustain flow through the cycle.

Figure 10:
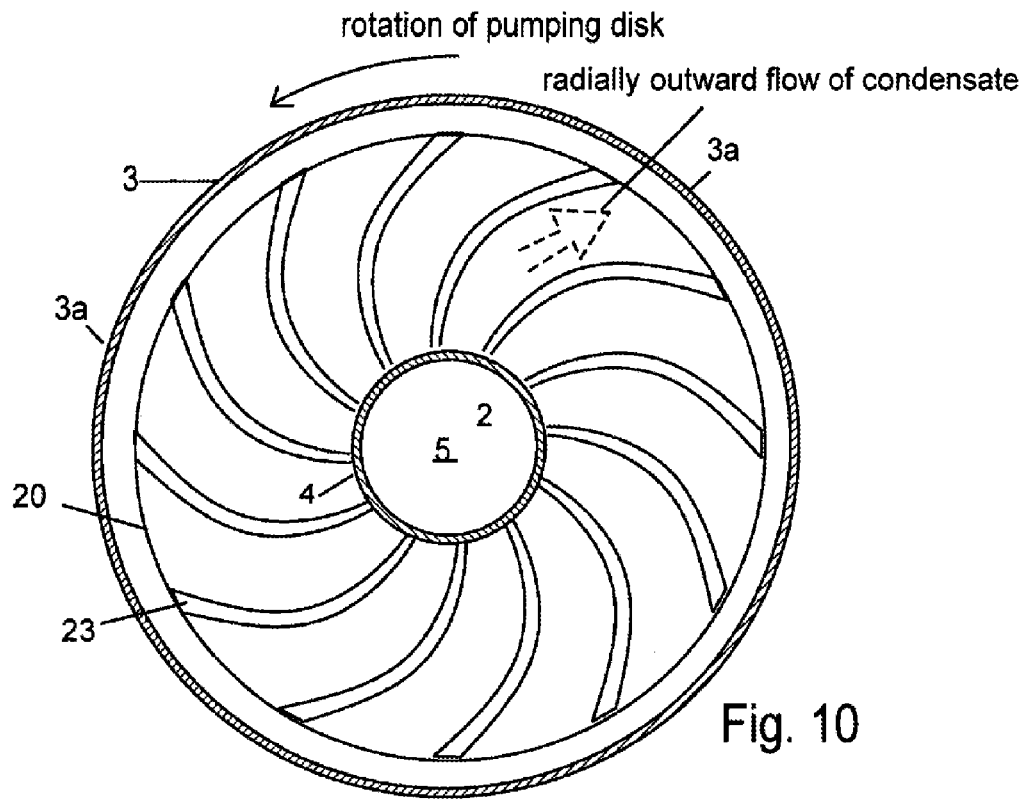
FIG. 10 shows a detail of the top surface of the centrifugal pumping disk 20 and its runners 23.

FIG. 10 shows a detail of the runners 23 on the top surface of the pumping disk. The runners assure that the mass flow between the pumping disk 20 and the heating surface 2 below it is radially inward to the axis a-a. Alternatively, a rugose top surface could be used. Or the bottom surface of the pumping disk could comprise centripetally advecting spiral runners. Centripetally advecting runners would be in opposite orientation with respect to the direction of rotation shown for the top surface runners. In other words, they would scoop in rather than push out the working fluid.

FIG. 11 shows a number of motherboards comprising chips 26 on boards 27. The motherboards are disposed in a vertical orientation as they might be in a data center. A vapor vortex heat sink 3 according to the present invention is in thermal communication with the chips through a heat collector 24 and its attached heating fins 25. The fins 25 thermally connect to the chips through thermal grease, in a manner and with products known to the art. The fins 25 collect waste heat from the chip and conduct it to the heat collector 24 which is in contact with the heating surface 3a of the casing 3. The heat collector and the heating fins could be made of copper or aluminum, or could be sheet comprising heat pipes of designs known to the art. The fins would be formed to maximize the surface contact and conduction of heat from the heated surfaces, while minimizing the overall surface area that would re-radiate this heat out elsewhere before it could be communicated to the heat collector and the heat sink.

Figure 12:
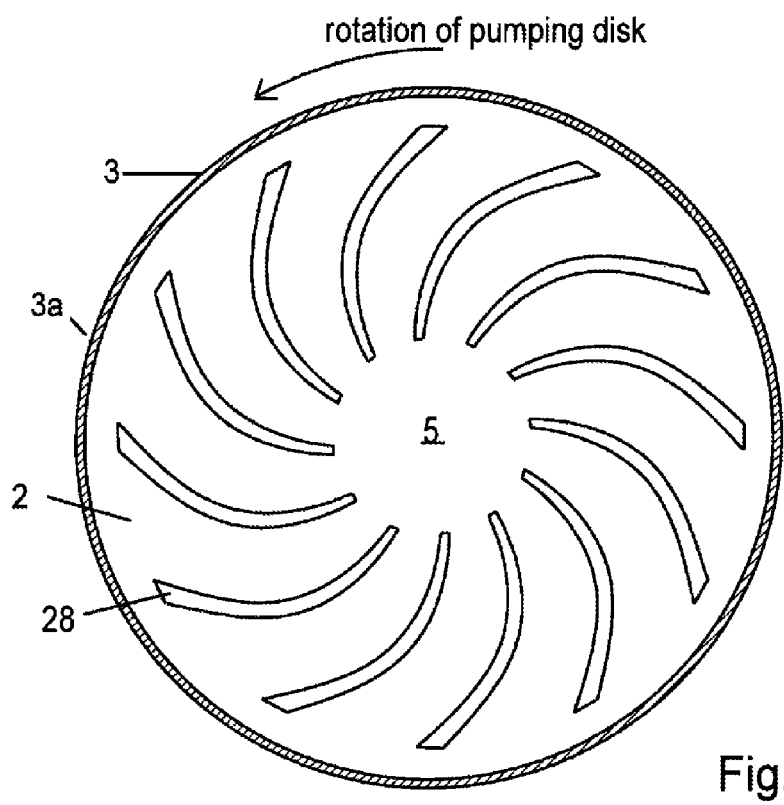
FIG. 12 shows a top view of the heating surface 2 and its radial volutes 28.

FIG. 12 shows a top view of an alternative embodiment of the heating surface 2 comprising volutes 28. The radial array of spiral volutes keep the pumping disk 20 separated from the heating surface 2. The pumping disk 20 can engage the volutes 28 of the heating surface 2 by means of an annular bearing assembly 29. This is shown in FIG. 14. Radial vortices 21 are maintained in the radial channels defined by the volutes 28, the lower surface of the pumping disk 20, and the heating surface 2 by simultaneous (1) shear due to rotation of the pumping disk 20, and (2) suction of vapor into the vapor space 5 due to the condensation of vapor in the condensing end 3b of the casing 3. Flow through the cores of the radial vortices 21 is radially inward to the vapor space 5.

FIG. 13 shows a flow diagram of the totally hermetic Rankine cycle disclosed in the present invention. Work of the turbine is conserved in the cycle to rotate the pump and is not exported to a generator or other device in the environment. The pump of the cycle is not powered by work from the environment. Contrast the flow diagram of the conventional Rankine cycle, shown in FIG. 9, where work is not conserved in the cycle and work is imported to run the pump to sustain the cycle.

FIG. 14 shows a detail cross-section of an alternative embodiment having the pumping disk 20 in contact with an annular bearing assembly 29 engaging the volutes 28 of the heating surface 2. See also FIG. 15. The annular bearing assembly 29 is disposed between the pumping disk 20 and the volutes 28 of the heating surface to minimize friction between them and to maintain separation of the pumping disk from the heating surface so as to allow the formation of radial vortices 21. The annular bearing assembly 29 can be of many designs known to the art, including ball bearings sandwiched between bearing races. The working fluid bathing the annular bearing assembly can also act as a lubricant for it. If the bearing assembly forms an attachment between the volutes and the bearing disk, then the thrust bearing 10 is not needed to maintain the proper orientation of the vortex organizer and the pumping disk as they rotate within the casing. FIG. 15 shows where the annular bearing assembly 29 is situated with respect to the vortex organizer 4. It maintains separation and proper orientation of the vortex organizer from the casing 3 in the alternative embodiment shown in FIG. 15 and FIG. 16. The radial vortices 21 between the volutes 28 provide sink flow conduits for low density fractions, including warm water and vapor, into the vapor space 5, and the area of the annular bearing assembly is small enough that it does not subtract from the necessary contact surface area between the pumping disk and the working fluid. The volutes 28 increase the surface area of the heating surface 2. This increased surface area is continuously swept by the radial vortices, thereby removing nucleated vapor into the core of the radial vortices to be sucked into the vapor space 5.

The preferred embodiment described above in FIG. 1 shows a relatively short conduit between the heated surface and the heat sink, containing a relatively long vortex organizer with a pivot pin assembly, but an alternative embodiment shown in FIG. 15 and FIG. 16 uses a long conduit with a short vortex organizer without a pivot pin assembly, wherein the vapor is transported a considerable distance between the evaporating end and the condensing end.

FIG. 15 shows a detail cross-sectional view of the evaporating end 3a of an alternative embodiment. The condensing end 3b is shown in FIG. 16. The extended casing 3 connecting the evaporating end to the condensing end is omitted in this drawing, but this connecting casing is long enough to transport vapor to a convenient location for heat rejection by a heat sink 8 having adequate cooling power. This extended casing 3 can be in the form of a rigid or flexible tube. Vapor vortex centrifugation de-mists vapor before it enters the condensation chamber 7. Condensate in the vapor stream is centrifugated due to its higher density and impinges the wall of the extended casing 3, then flows down the wall into the evaporating end. Alternatively, a separate annular condensate space defined between a static interior wall and the casing could prevent heat exchange between the condensate and vapor going into the condensation chamber 7. If the condensate and vapor are allowed to remain in contact throughout this extended casing, such as by the condensate dripping back along the interior walls, then heat will recycle back into the condensate without being carried out to the heat sink. The means for maintaining separation of the pumping disk 20 and the heating surface 2 comprises an annular bearing assembly 29 engaging the pumping disk and static volutes 28 on the heating surface 2, as shown in FIG. 14. The vortex organizer 4 disposed in the evaporating end 3a comprises a vapor space 5 wherein vapor from the space between the heating surface 2 and the pumping disk 20 collects and moves to the condensing end 3b shown in FIG. 16. Liquid working fluid condensate returns from the condensing end and flows down the wall or within said annular condensate space to collect in the condensate space between the vortex organizer 4 and the casing 3. The net liquid level is shown to be below the top of the vortex organizer 4. Mass flow through the vapor space 5 from the evaporating end to the condensing end of the extended hermetic casing causes the vortex organizer 4 and its attached pumping disk 20 to rotate and pump condensate in the condensate space radially out from the axis of rotation a-a to the periphery of the evaporating end 3a, and into the space between the heating surface 2 and the pumping disk 20 where the liquid becomes vapor due to heat transfer from the heat source 1.

FIG. 16 shows the condensing end 3b of the alternative embodiment discussed above. No pivot pin assembly is within the vapor condensation chamber 7. Axial counterflow of vapor into and condensate out of the vapor condensation chamber 7 is shown by arrows. The heat sink 8 is a device for heat rejection which can be of many types known to the art of heat exchangers. Its job is to provide a cool surface 6 for extracting latent heat of evaporation from the working fluid vapor evolved at the heating surface 2, and to reject that waste heat to the environment by suitable means. Air cooling and evaporative cooling are among the suitable means known to the art. The alternative embodiment provides means for connecting a high cooling power heat sink of conventional design to a remote high heat flux heat source, without lines of cold liquid dripping condensate near sensitive electronic components.

A reaction turbine connected to a drive spindle, as shown in FIG. 6, could be disposed in the condensation chamber 7 with the drive spindle 16 protruding from the top of the condensing end 3b of the casing 3. The reaction turbine 13 would not be attached to the vortex organizer 4 as in the preferred embodiment shown in FIG. 1 but would rotate independently due to convective mass flow through it and thereby would independently rotate the drive spindle 16 to produce electric power from waste heat. Although separate components, the vortex organizer and reaction turbine in this alternative alternative embodiment would both drive the vapor vortex from its two ends in the same direction. The vortex organizer would assist mass flow into the reaction turbine by keeping the reaction turbine feed organized in a cyclone of low enthalpy saturated vapor.

Further Remarks

Means for rotation of the vortex organizer 4 about the axis a-a in the preferred embodiment shown in FIG. 1 include (1) mass flow impinging vapor runners 11 on the inside of the vortex organizer 4; (2) mass flow impinging condensate runners 12 on the outside of the vortex organizer 4; (3) rotation of the reaction turbine (Hero's engine) provided by the pivot pin assembly 13 due to the effect from vapor flow through the vapor channels 14, 15; and (4) external drive means 17 communicating through the spindle 16 with the pivot pin assembly 13. In the alternative embodiment shown in FIG. 15 and FIG. 16 the means for rotation of the vortex organizer 4 is mass flow impinging vapor runners 11 on the inside of the vortex organizer 4 and there is no reaction turbine 13 shown connected to the vortex organizer. However, a reaction turbine such as the pivot pin assembly 13 which is not connected to the pumping disk but is connected to a drive spindle 16 as shown in FIG. 6 could be used in another alternative embodiment for extracting work. In this alternative embodiment, no work is imported to run the pump, because the rotation of the vortex organizer does that, and work is exported to run a generator, because the reaction turbine takes care of that. The vapor vortex established by the vortex organizer keeps counterflow of condensate and vapor separate even without the intervening wall of a vortex organizer all the way to the condensing end. The axis of rotation a-a of the vapor vortex, the vortex organizer 4, and the pumping disk 20 connected to it is approximately at the centerline a-a of the casing 3.

There is no external drive means for rotating the turbine or for operating the pump of the Rankine cycle in the alternative embodiment. Energy from the turbine is conserved within the cycle to run the pump completely, with no supplementary energy input from the environment in the form of work. The alternative embodiment practices a completely hermetic Rankine cycle wherein no work is either imported or exported. The preferred embodiment shown in FIG. 1 practices a partially hermetic Rankine cycle wherein no work is imported during the cycle, but some work may be exported through the drive spindle 16 to drive a generator 17 or imported on startup.

The hermetic Rankine cycle disclosed in the present invention is practiced by the preferred embodiment and by the alternative embodiment because the pump of the cycle is powered entirely by the turbine of the cycle. The boiler of the hermetic Rankine cycle, FIG. 13, comprises the heating surface 2, which transfers heat into the working fluid confined between it and the pumping disk 20. The turbine is the vortex organizer 4, which through its vapor runners 11 transforms some of the heat energy into work. The work of the turbine, however, is not exported as in a conventional Rankine cycle, FIG. 9, but is conserved to run the pump. The condenser is a heat sink 8 of known design, such as a chiller in thermal communication with means for refrigeration or a shell-and-tube heat exchanger with evaporative cooling for the cooling water. The heat sink 8 causes the turbine exhaust from the vapor chamber 5 to become liquid, thereby reducing the volume of the turbine exhaust so as to create a vacuum in the condensation chamber 7 which sucks more vapor through the turbine, which is the vortex organizer 4. The pump is the pumping disk 20 which is connected to the vortex organizer 4. The pump is driven by work supplied by the turbine, making this Rankine cycle hermetic because work as well as mass is conserved. Mass flow cycles through the present invention driven by waste heat flow between the heat source 1 and the heat sink 8, with no work exported or imported. A useful comparison is a hurricane.

Cascading devices according to the present invention, such that the heating surface 2 of a subsequent stage thermally communicates with the condensing surface 6 of the previous stage, could transfer waste heat a long distance in linked devices, to a convenient heat sink 8. The operating temperatures of the various stages would decrease up the cascade. Waste heat flows from capillaries into larger conduits and eventually to very large waste heat conduits serviced by many kilowatts of cooling power.

Heat pipes of conventional designs known to the art could be used in place of the fins 25 shown in FIG. 11 to draw waste heat from hot chips and into the heat collector 24. For example, heat pipes bundled together in sheets could be used. Heat pipes have approximately four times greater thermal conductivity than copper.

An organic working fluid might be preferable in applications where a relatively small burden of waste heat is extracted. For higher heat flux, water at low pressure might be preferable because of its high latent heat of evaporation and its low cost. Although water has the disadvantage of low molecular mass, the mass flow in such high heat flux applications might be high enough to drive the vortex organizer 4 and the pumping disk 20 so as to sustain the hermetic Rankine cycle in the vapor vortex heat sink. Experimentation and calculation by those of ordinary skill should discover the appropriate working fluid for particular applications of the total or partial hermetic Rankine cycle disclosed in the present invention. Noncondensible gases should be purged from the casing so that their presence does not impede condensation. One means for preventing noncondensible gas intrusion during operation, in addition to a tight seal around the drive spindle 16, is a pressure within the casing which is in excess of atmospheric pressure (1 bar), which can be achieved by using a working fluid having a low boiling point.

One example of a suitable working fluid for a hermetic organic Rankine cycle for heat extraction and/or power generation as disclosed in the present invention is HFC-245fa ($CF_3CH_2CHF_2$) marketed by Honeywell as Genetron 245fa. This environmentally benign organic compound has a low boiling point (15° C. at 1 atmosphere, 100 kPa) and it has a high molecular weight (134) so its saturated vapor at any temperature will have a very much higher density than saturated water vapor at that temperature and can therefore drive a compact turbine with a low temperature heat source. Operating between a heat source of 149° C. (300° F.) and a heat sink of 38° C. (100° F.) its thermodynamic efficiency (relative to Carnot) is 59.9%. The boiler pressure is 3213 kPa (466 psi) and the condenser pressure is 132.4 kPa (19.2 psi). The slightly higher-than-atmospheric condenser pressure prevents noncondensibles from entering but is not so high as to challenge sealing means for the drive spindle 16.

Applications of the present invention might include waste heat extraction from injection mold cooling water, chemical reactors, seals on rotating machinery such as turbines, data centers, turbine exhaust steam, and equipment used in food or beverage processing. Another application is waste heat extraction from the cooling water of heat exchangers at refineries or electric power plants, as an alternative to water-wasting evaporative cooling towers or thermally-polluting open liquid cooling systems. More effective turbine exhaust steam condensing would increase the efficiency of power generation as well as conserve water.

Yet another application is for organic Rankine cycles to convert waste heat into work. In such Rankine cycles, the spindle 16 would connect to an external device, such as a generator or a motor, to drive and not be driven by the external device. The cycle would be only partially hermetic, because some energy is exported as work to the external device, and some is conserved in the cycle to run the pump.

A heat source for organic Rankine cycle power generation by means of the present invention could be gas turbine exhaust from a Brayton cycle at an IGCC power plant.

Geothermal heat sources, typically between 100° and 350° C., which are too low for efficient water vapor cycles, could be used for power generation by organic Rankine cycles as disclosed in the present invention.

Underground heat sinks, such as aquifers, in combination with the present invention, could provide the ultimate heat sink for rejection of waste heat from data centers and other sources. Even air cooling by an atmospheric heat sink could be sufficient for waste heat extraction.

The invention claimed is:

1. An apparatus for heat exchange between a heat source and a heat sink, comprising
    (1) at least one sealed casing having a centerline and comprising
        an evaporating end at one end of the casing, the evaporating end comprising a heating surface thermally communicating with the heat source, and
        a condensing end at the other end of the casing, the condensing end comprising a condensing surface thermally communicating with the heat sink, the heat sink structured to reject heat from the apparatus;
    (2) a working fluid hermetically contained within the casing;
    (3) a vortex organizer positioned within the casing between the evaporating end and the condensing end, the vortex organizer being rotatable about an axis positioned approximately along the centerline and being spaced apart from the casing and defining an annular condensate space between the vortex organizer and the casing, the annular condensate space structured to provide a path for condensate to flow from the condensing end to the evaporating end, the vortex organizer further comprising
        a central vapor space that provides a path for vapor to flow from the evaporating end to the condensing end, and
    (4) a centrifugal pumping disk coupled to the vortex organizer, the pumping disk coupled within the evaporating end of the casing and spaced apart therefrom, the centrifugal pumping disk defining
        an advection space between the casing and the pumping disk, the advection space communicating with the condensate space, and a radial vortex space between the pumping disk and the heating surface, the radial vortex space communicating with the advection space and the vapor space through an aperture at the center of the pumping disk.

2. The apparatus of claim 1, further comprising:
radial volutes positioned on the heating surface, the radial volutes defining radial channels for flow of the working fluid radially inward to the axis of rotation; and
an annular bearing assembly positioned between and coupled to the pumping disk and the volutes on the heating surface.

3. The apparatus of claim 2, wherein the radial volutes extend in the radial vortex space.

4. The apparatus of claim 1, further comprising:
a static wall positioned between the vortex organizer and the condensate space.

5. The apparatus of claim 1, further comprising:
thermal insulation in the vortex organizer positioned between the vapor space and the condensate space.

6. The apparatus of claim 1, further comprising:
thermal insulation in the casing.

7. The apparatus of claim 1, further comprising a drive spindle that connects the vortex organizer to an armature of a generator, the drive spindle extending through the casing at the condensing end.

8. The apparatus of claim 1, wherein the heating surface comprises a heat source positioned within the radial vortex space.

9. The apparatus of claim 1, wherein the vortex organizer includes runners.

10. The apparatus of claim 1, further comprising a reaction turbine positioned within the condensing end.

11. The apparatus of claim 1, wherein the working fluid includes an organic compound.

12. The apparatus of claim 11, wherein the working fluid includes HFC-245fa.

13. The apparatus of claim 1, wherein the working fluid includes water.

14. The apparatus of claim 1, further comprising a plurality of heat sources thermally connected to the heating surface.

* * * * *